United States Patent [19]

Wilson

[11] Patent Number: 4,534,015

[45] Date of Patent: Aug. 6, 1985

[54] INFORMATION HOLDING DEVICE

[75] Inventor: Edward G. Wilson, London, England

[73] Assignee: QMC Industrial Research Limited, London, England

[21] Appl. No.: 420,000

[22] Filed: Sep. 20, 1982

[30] Foreign Application Priority Data

Oct. 5, 1981 [GB] United Kingdom ............... 8130024

[51] Int. Cl.³ .............................................. G11C 13/08
[52] U.S. Cl. ..................................... 365/106; 365/107
[58] Field of Search ................................ 365/106, 107

[56] References Cited

U.S. PATENT DOCUMENTS

3,935,493 1/1976 Brouwer ........................... 365/106

Primary Examiner—James W. Moffitt
Attorney, Agent, or Firm—McAulay, Fields, Fisher, Goldstein & Nissen

[57] ABSTRACT

A memory comprises a multilayer Langmuir-Blodgett film (1) in which each layer (2) is capable of carrying a charge. A photo-injector layer (D) is located on one side of the film for introducing charges into the film in a time sequence which corresponds to the information to be carried. Voltage source (6) is provided for applying a voltage between the faces of the film to cause the charge carried by any layer to be transferred to the adjacent layer. The sequence of charges carried by the film may be read out by a photon-emitting electron arrival detector (F) on the opposite side of the film, or by a method of current differentiation. The film (1) is preferably formed of a polydiacetylene.

18 Claims, 16 Drawing Figures

INFORMATION HOLDING DEVICE

FIELD OF THE INVENTION

This invention relates to an information holding device. The device is referred to below as a memory, though it is to be understood that the information may be held only briefly, in which case the device may function, for example, as a delay line, or the information may be held for a longer time, in which case the device may function as a normal memory.

BACKGROUND OF THE INVENTION

In recent years, memories have been developed, for example for computers, which have been increasingly compact, but there is, nevertheless, a demand for still more compact memories. An object of the present invention is to provide such a memory, and in particular a memory employing a Langmuir-Blodgett film (hereinafter referred to as an L-B film).

Before the invention is described in detail an outline will be given of the nature and properties of L-B films.

Many molecules having a hydrophilic and hydrophobic end, for example long chain fatty acids, form insoluble monolayers at an air-water interface. The packing in the monolayer may be controlled by the application of surface pressure through barriers and the equation of state of the film is given by the surface pressure-area isotherm. When an appropriate substrate, for example glass, silicon or indium phosphide, is dipped through the air-water interface then one monolayer may be transferred to the substrate each time the interface is traversed. A film of great perfection can thus be built up a single monolayer at a time. It has been demonstrated that it is possible to build up extremely precise supermolecular structures consisting of fatty acids, long-chain dyes and similar molecules for the study of electron and exciton transport. More recently it has been demonstrated that fatty acids with certain substitutes, for example a diacetylene group, may be polymerized either at the air-water interface or after the film has been prepared.

Charge and energy transport in L-B films will now be summarized.

(a) Electron tunneling.

Monolayers of fatty acids with varying chain lengths, and hence varying thickness, have been prepared as a sandwich between conducting aluminium layers. The electrical conductivity of such films has been demonstrated to decrease logarithmically with increasing monolayer thickness. This is the result which would be expected if the currents were due to electrons tunneling through the dielectric monolayers. With some reservations this view is generally accepted as is the conclusion that these experiments demonstrate the remarkably perfect quality of the monolayers.

(b) Exciton transfer.

Monolayers of dye substituted fatty acids commonly exhibit the characteristic absorption and fluorescence spectra of the isolated dye. Detailed investigations have been made of energy transfer from one type of dye in one monolayer to a second type of dye in neighbouring or more distant monolayers. If for example a sensitizer dye S which absorbs in the UV and emits in the blue is incorporated in an L-B film assembly with an acceptor dye A which absorbs in the blue and emits in the yellow then considerable energy transfer can occur. Under UV illumination the blue fluoresence is partially quenched by the presence of dye A and yellow fluorescence appears. The relative quenching of dye A fluorescence depends upon the proximity of dye S in a manner predicted by the classical electric dipole model.

(c) Photoinduced electron transfer.

Electron as well as exciton transfer has been observed between different chromophores in multilayer assemblies. In this case when the photon is absorbed an electron is transferred from one molecule acting as the donor D to the second acting as acceptor A. Quenching of fluorescence is observed in monolayer assemplies if donor and acceptor are in the same monolayer or at the hydrophilic interface between adjacent monolayers. When D and A layers are separated by a single fatty acid monolayer it has been possible to observe this transfer as a photocurrent.

(d) Compensated photoinduced electron transfer.

In general the photoinduced electron transfer D - A is reversible and in the dark the electron will return A - D. The reverse process can be inhibited if an electron source molecule ES can supply an electron to the photo-oxidized donor. This possibility has been demonstrated by a monolayer sandwich: ES (leucostearylenblue), D (ω-pyrenestearate), fatty acid, A (dioctadecyl-bipyridinium). Under illumination the system acted as an inefficient electron pump.

(e) Photoinduced electron release.

Photocurrents can be generated from a layer of an absorbing molecule located in a film of fatty acid layers if the excited state energy level of the absorber lies close to the potential barrier of the fatty acid layers. It is known that this is possible for the linear conjugated molecule quinquethienyl for which the excited state lies 0.4eV below the potential barrier of arachidate layers.

The potential of the L-B multilayer technique for the fabrication of supramolecular structures has been amply demonstrated, as described above. However, the practical application of structures with photo-excited energy and charge transfer has been inhibited by the poor stability of L-B multilayers primarily composed of fatty acids. This arises from the low melting points of the long-chain fatty acids and the large amplitude molecular motions, which give rise to solid-state phase transitions below the melting points of paraffinic crystals. Thus, the ceiling temperature of fatty-acid L-B multilayers is close to room temperature and they exhibit pronounced ageing, with consequent changes in physical properties, due to molecular re-arrangement within the L-B layers.

One solution to this problem, which has been extensively studied over a number of years, is the inclusion in the monolayer-forming molecules of reactive units capable of producing polymer chains within the layer. Such reactions can occur in L-B layers since the molecular packing within each layer brings the reactive units into close contact. Molecules containing double bonds were studied first, e.g vinyl stearate and octadecyl methacrylate. polymerization was observed with UV and electron beam irradiation but the materials were found to oxidise readily, so that all film preparation has to be carried out in an inert atmosphere, and the dimensional changes on polymerization gave a rather imperfect product.

The solid-state topochemical polymerization of certain di-substituted diacetylenes has been known for some time. This polymerization is insensitive to normal atmosphere and there followed development to investigate the properties of L-B films made from fatty-acids containing diacetylinic units. The topochemical polymerization was found to occur under UV in irradiation in air and the dimensional changes were sufficiently small that the final films were as perfect as the initial monomer films.

The stability and quality of polydiacetylene L-B multilayers has been shown by their inclusion in MIS devices. Although the conditions for the formation of pin-hole free L-B monolayers are more stringent than those for the unsubstituted fatty acids they are now well documented in the literature so that routine fabrication is possible. The ceiling temperature of polydiacetylene L-B films has not been critically determined. Values in excess of 200° C. are to be expected since this is the regime in which polydiacetylene crystals are observed to decompose. In one case the first stage of this decomposition has been identified as cleavage of the bulky, reactive sidegroups, probably initiated by absorbed oxygen. This suggests that diacetylenes with less reactive paraffinic sidegroups are likely to decompose at higher temperatures. Ageing of the polymerized films should be negligible since on polymerization the paraffinic side chains are locked in place by the polymer chains, which prevents any translational motion either in or out of the plane of the film. This is revealed most dramatically by the disappearance of phase transitions in both the pure acids and their salts. It should be emphasised that the incorporation of polydiacetylene chains into L-B multilayers offers benefits in addition to providing more durable films. These derive from the properties of the PDA chain, which is a wide band-gap wide band semiconductor with strong electron-hole interaction. Thus the PDA-chains can play an active role in the photo-excitation of energy and charge transfer through L-B multilayer structures.

The electronic and vibrational excitations of the conjugated polydiacetylene backbone are now very well understood. Optical absorption and reflection spectroscopy have demonstrated the existence of an exciton state on the backbone at approximately 2eV while photoconduction measurements have shown that the conduction band lies 2.4eV above the valence band. Resonance Raman spectroscopy has revealed that only a few phonons on the backbone are strongly coupled to the exciton. The most prominent of these are at $2100 cm^{-1}$ and $1500 cm^{-1}$; lattice dynamical analysis of the backbone has shown that the former mode primarily involves distortion of the triple bond while the latter involves the double bond.

BRIEF SUMMARY OF THE INVENTION

According to the present invention there is provided a memory for carrying information comprising a multilayer Langmuir-Blodgett film in which each layer is capable of carrying a charge; means located adjacent one face of the film for introducing charges into the film in a time sequence which corresponds to the information to be carried, means for applying a voltage between the faces of the film to cause the charge carried by any layer to be transferred to the adjacent layer, and means for reading out the sequence of charges carried by the film.

Preferably the layers of the Langmuir-Blodgett film (hereinafter referred to as an L-B film) are polymeric, and they may, for example, be formed of a polydiacetylene (PDA).

Materials for the film which are particularly suitable are ones, like polydiacetylene, which have a conjugated bond structure, as such structures have a low energy gap.

DETAILED DESCRIPTION OF PREFERRED EMBODIMENTS

Figure 1:
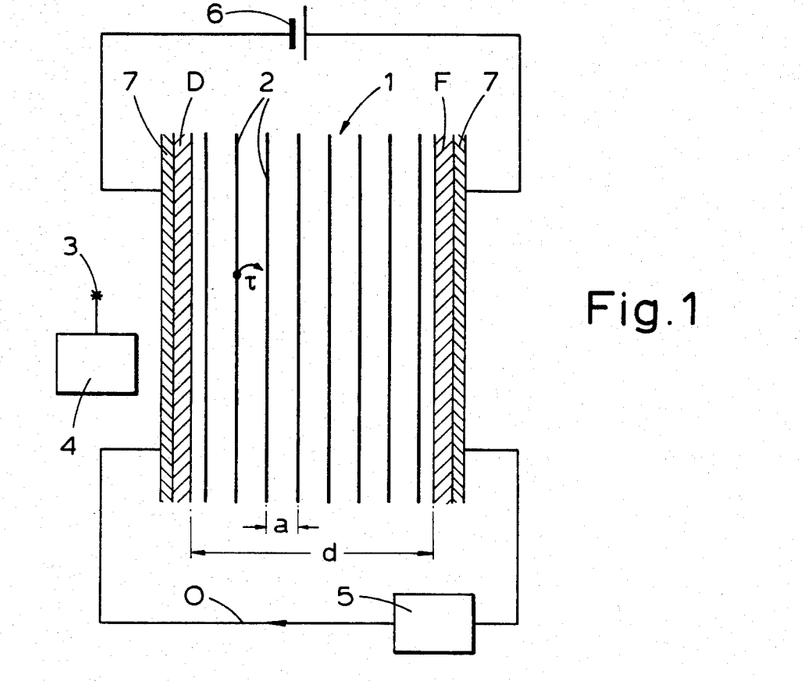
FIG. 1 shows diagramatically a first embodiment of the invention.

The embodiment shown in FIG. 1 comprises an L-B film 1 formed of a plurality of n layers 2 (eight are illustrated) of PDA. The layers are spaced a distance a apart from one another and the overall film thickness is d. Adjacent one face of the film 1 is a layer D of electron donor molecules which require a photon energy above $\hbar \omega_D$ to donate. $\hbar \omega_D$ is the energy needed to take an electron from the donor layer D and put it in the conductance band of the PDA. A source 3 of photon energy is provided, and the drawing also shows a means 4 for modulating the output of the source 3 in a manner described below. Adjacent the other face of the file 1 is a layer F of molecules which fluoresce on receiving an electron. An optical loop O feeds the output of the layer F back to the layer D. Since the quantum efficiency of the layer D and the layer F is less than unity the loop O must have gain.

For the purposes of amplification the optical signal produced by the layer F could be converted into an electrical signal which could then be amplified, or amplification of the optical signal could take place directly without such conversion. A voltage source 6 applies a d.c. voltage across the film 1 via electrodes 7. In some cases, as will be apparent from what is said below the layers D and F could themselves function as electrodes. An amplifier 5 is diagramatically shown.

To understand the behaviour of the embodiment described above, consider the fate of an extra electron resident in the conduction band of one chain. It diffuses rapidly in the plane. It has a long jump time $\tau$ to the next plane, estimated by Mott type argument as $$1/\tau = \nu \exp(-2ka) \qquad (1)$$

where $\nu$ is a phonon frequency. An estimate of k is given by $$k^2 = 2mA/\hbar^2 \qquad (2)$$

where A is the electron affinity, and m is the electron mass.

So the diffusion coefficient D and mobility $\mu$ in a perpendicular direction are $$D = a^2/\tau,$$

$$\mu = (e/k_B T)d \qquad (3)$$

where e is the electron charge, $k_B$ is the Boltzmann constant, and T is the absolute temperature.

There are three regimes of possible applied voltage V across the film:

(A) For $0 < V < k_B T/e = V(1)$ diffusion dominates drift in the perpendicular transport.

(B) For $V(1) < V < n^2 k_B T/e = V(h)$ drift dominates diffusion over the film thickness d but not over the layer separation a.

(C) For $V(h) < V$ drift dominates diffusion even over the layer separation. In this regime the energy difference between an electron in adjacent layers is greater than $k_B T$ and back jumping against the field is rare. The mobility also becomes field dependent.

The transit time across the film due to drift, at velocity v is $t = d/v = d/\mu E = d^2/\mu V$. Using equation 3 then $$t = n^2 \tau, v = a/n\tau, \text{ at } V = V(1)$$

$$t = n\tau, v = a/\tau, \text{ at } V = V(h)$$

An approximate estimate of the actual magnitude of the figures involved is as follows.

At room temperature $k_B T/e = 25$mV which is also V(1).

So for a film of 8 layers $V(h) = 0.2$ volt.

The values of D, $\mu$, $\tau$ and t are exponentially sensitive to a (and A). Taking a=1nm and A=4eV(and $\nu = 10^{14}$Hz) then $\tau = 8.8$ $\mu$s. So, with 0.2 volts applied, an electron put on the first layer will jump to adjacent layers every 8.8 $\mu$s and emerge out of layer 8 after 70 $\mu$s.

Because of the above mentioned exponential dependence different devices with small differences of a or A can have large differences of t and $\tau$.

In operation of the above described device the photon energy, for example light, emitted by the source 3 is pulse-code modulated by the modulation means 4, the pulses having a width < t and a period t/n, while the voltage V>V(h) is applied across the film. Because of the synchronism between the period of the pulse train and the jump time for an electron to jump from one plane to the next the pulse train is translated into a corresponding spatial charge distribution across the film. Thus, for example, if the pulse train emitted by the source 3 is 10011010 then after a time equal to t has elapsed there will be a corresponding charge distribution 10011010 across the width of the film, 0 and 1 corresponding respectively to the absence and presence of charge on an individual layer of the film. This charge pattern is continuously cycled through the device by the action of optical loop O.

It is to be understood that although the description of the drawing refers only to a single electron on a particular layer there could in practice be a group of electrons. Thus, consider a device of area $A_c$ containing a charge Q. There is an upper limit to Q at a given applied electric field E, denoted $Q_m$, set by space charge considerations, and given by $$Q_m = \epsilon \epsilon_o A_c E.$$

Here $\epsilon$ and $\epsilon_o$ are the dielectric constant of the medium and permittivity of free space respectively. So in a device of n layers the upper limit to q, the charge on one layer, is $q_m$, and $$q_m = \epsilon \epsilon_o A_c E/n.$$

Suppose the arrival of an electron at F leads to the fluorescence of a photon of energy $V_L$ electron volts with quantum efficiency $\eta$. Then the arrival of one bit at F, over a time duration $\tau$ which is the hop time, gives a maximum fluoresced power P given by $$P = \eta q_m V_L/\tau$$

It may be noted at this stage that the above described device uses electron arrival detection (abbreviated herein as EAD) and an alternative detection method, namely current differentiation (abbreviated herein as CD) is described later on in this description.

The above description refers to the storage of one bit per layer. However, an alternative possibility is to use n layers to store n/M bits, so that the bits are M layers apart. This has the advantage that diffusion, destroying the spatial coherence of the store, is less significant. Using the previous equations, then the criterion for adjacent bits not to diffuse together after N cycles round the device is $V/V(h) > N/M^2$.

Figure 2:
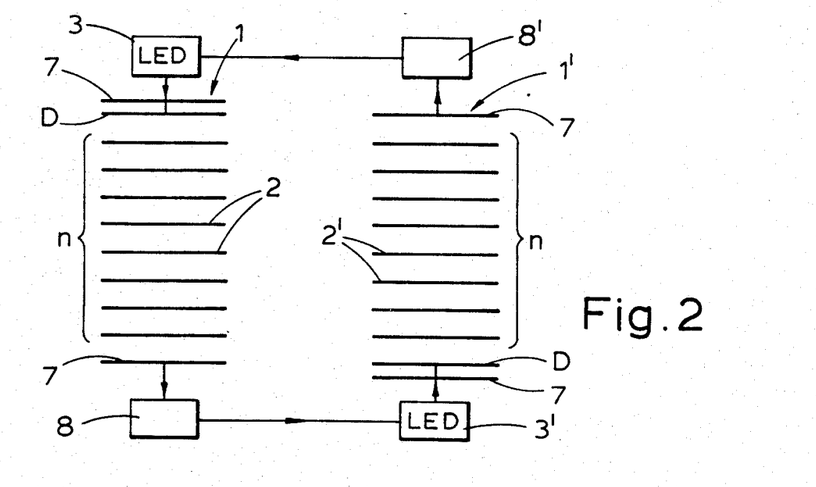
FIG. 2 shows diagramatically a second embodiment of the invention.

FIG. 2 shows an embodiment employing current differentiation (CD). This comprises a pair of devices 1 and 1' each comprising n layers 2,2' of PDA. Each device has a layer D of electron donor molecules but no layer F as in FIG. 1. Each device is provided with a source 3,3' of photon energy, in the form of a light-emitting diode (LED). Each device is further provided with a current differentiation detector 8,8' for detecting, in a manner described below, the current in the device. The current detector of each device is coupled to the LED of the other device so that information is continuously cycled around the arrangement consisting of the pair of devices. Each device is further provided, as in FIG. 1, with a device (not shown) for modulating the output of the source 3,3' and a voltage source 6 (not shown) for applying a d.c. voltage across the electrodes 7.

Figure 3A:
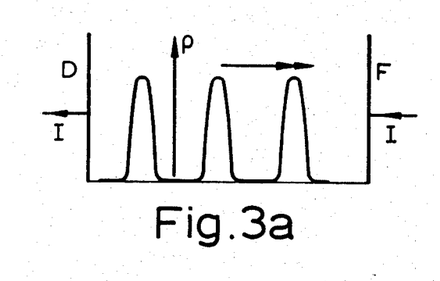
FIGS. 3a to 3f illustrate the detection of charge and current in the devices of the invention.
Figure 3B:
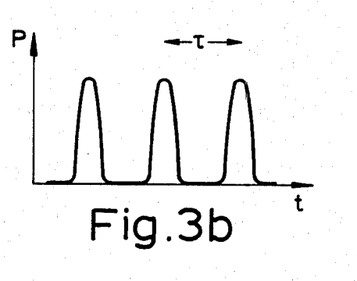
Figure 3C:
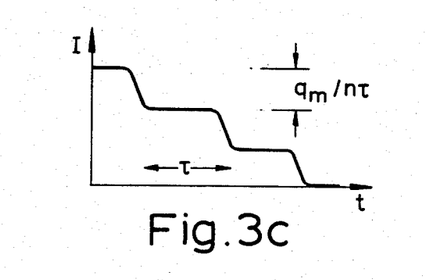
Figure 3D:
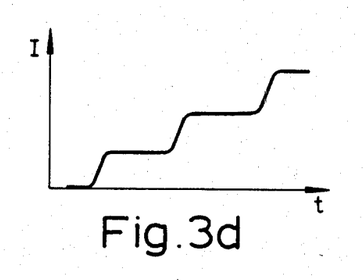

Reference will now be made to FIGS. 3a to 3f which illustrate the operations of electron arrival detection and current differentiation for a bit pattern 0011100. FIG. 3a represents the charge density $\rho$ as a function of position, the double-headed arrow denoting the direction of travel of the bits. The maximum charge in any one bit is $q_m$. FIG. 3b represents the fluoresced power P from the layer F as a function of time t, the maximum power being $\eta q_m V_L/\tau$. This is what is detected by electron arrival detection, as in FIG. 1. FIG. 3c shows the current I due to exit only of the bit pattern, as a function of time. The maximum change in this current over a duration $\tau$ due to the arrival of one bit at F is $$\Delta I = q_m/n\tau.$$

and the maximum change in the current due to the injection of one bit at D over a duration $\tau$ (FIG. 3d) is $$\Delta I = q_m/n\tau.$$

Figure 3E:
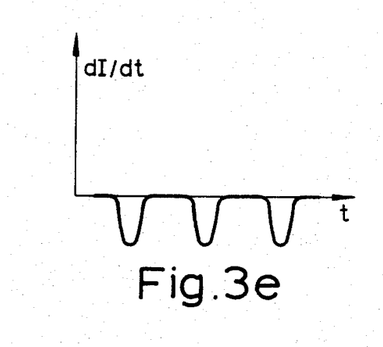
Figure 3F:
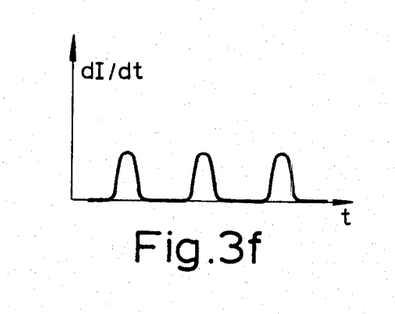

If this current is differentiated with respect to time then dI/dt due to the arrival of one bit F is a negative peak of duration and height $\Delta I/\tau$ (FIG. 3e), and dI/dt due to the injection of one bit at D is a positive peak of duration $\tau$ and height $\Delta I/\tau$ (FIG. 3f). This current differentiation (CD) method, in contrast to EAD, records entry of bits as well as exit of bits. Moreover they are recorded with different sign. If bits are entering simultaneously with their leaving then CD records no change; in contrast EAD records the exiting bits correctly whether bits are entering or not. The device of FIG. 2 is so arranged so that writing in of bits never overlaps in time the reading out of bits; in addition the signs of connections are chosen so that exiting bits only, and not entering bits, cause entry of bits of the next stage.

Another device using CD is described further on in this description.

The signal to noise ratio of given detectors of fluorescence (EAD) or differentiated current (CD) is determined by the products $P\tau$ and $\tau\Delta I$ respectively. The maximum value of these is:

$$P\tau = \eta q_m V_L = \epsilon\epsilon_o A_C E V_L \eta/n \text{ Joules, EAD,}$$

$$\tau\Delta I = q_m/n = \epsilon\epsilon_o A_C E/n^2 \text{ Coulombs, CD.}$$

Even if $\eta$ is small EAD is more sensitive than CD at sufficiently large n. Increasing the device area and operating field increase the signal strength.

With the numerical example already used i.e. $n=8$, $a=1nm$, $V(h)=0.2$ volts, $A=4eV$, $\nu=10^{14}Hz$, $\tau=8.8$ $\mu s$, and taking in addition $\epsilon=3$, $A_C=10^{-11}m^2$ (corresponding to $10^5$ such devices per $mm^2$), $V=2$ volts, then $$\Delta I = 6 \times 10^{-11} A,$$

$$P = 8\eta V_L \Delta I \text{ Watts.}$$

Figure 4A:
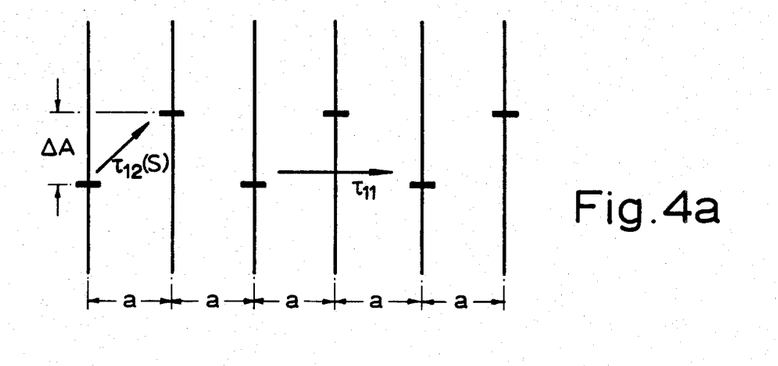
FIGS. 4a and 4b show the energy levels for a multilayer composed of two different materials, for small applied field and large applied field respectively.
Figure 4B:
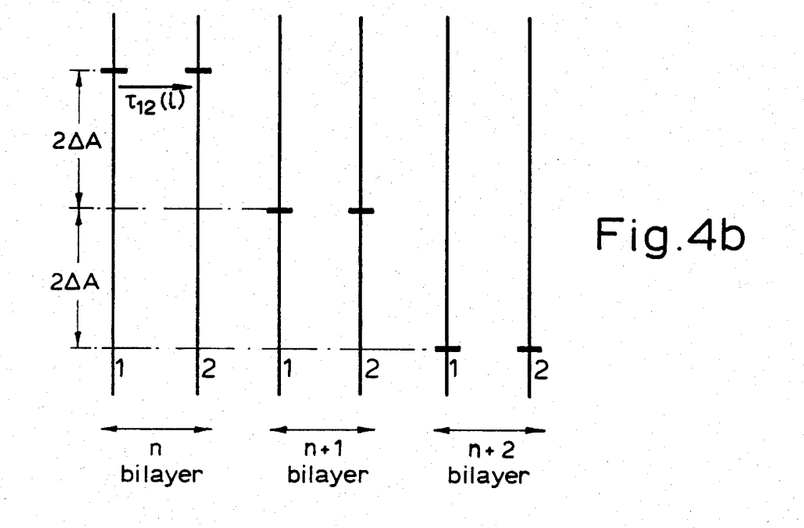

FIG. 4 illustrates diagramatically a film composed of alternate layers of two different materials, for example two types of PDA, which have different values of electron affinity A, differing by $\Delta A$. Different PDA's of different side groups, have energy gaps differing by up to 0.25 eV and corresponding differences occur also in A. Thus $\Delta A$ can be as large as 10 times the thermal energy $k_B T$ (at room temperature). The jump times denoted in FIGS. 4a and 4b are then $$1/\tau_{12}(S) = \nu \exp(-2ka) \exp(-\epsilon A/k_B T)$$

small or zero field, $E < \Delta A/ea$ $$1/\tau_{12}(l) = \nu \exp(-2ka)$$

large field, $E \geq \Delta A/ea$ $$1/\tau 11 = \nu \exp(-4ka).$$

where $\tau_{12}$ is the jump time from a layer of type 1 to an adjacent layer of type 2, and $\tau_{11}$ is the jump time from one layer of the type 1 to the nearest layer of type 1. Thus $$\tau_{12}(l) << \tau_{12}(s) << \tau_{11}.$$

Suppose these alternating layers are used to store one bit per 2 layers, so that $M=2$. (It is to be noted that this need not be the case and that there may be a plurality of layers of type 1 between adjacent layers of type 2 and/or a plurality of layers of type 2 between adjacent layers of type (1). Then for the large field the jump time is as before and the device behaviour is essentially unchanged (from the previous M=2 case). For the small field however, the bits are essentially frozen in the bilayers in the highest A chains for the time $\tau_{12}(s)$. Thus the hold time before diffusion destroys the static bit pattern is $\tau_{12}(s)$.

With the previous numerical example, and $\Delta A = 10 k_B T$ at room temperature:

$$\tau_{12}(l) = 8.8\mu s, \tau_{12}(s) = 0.19s,$$

and $$\tau_{11} = 2.17 \text{ hours.}$$

Thus, with such PDA alternating layers bits can be written into the device with the high field applied, stored for a time up to $\tau_{12}(s)$ with the field small or zero, and read out of the device with the high field re-applied. This alternating layer device is more complicated than the original device because the applied field now has to be controlled, i.e. it must be turned on and off in synchronism with the bits entering and leaving, but the information holding time is longer.

The read and write field, $E=\Delta A/ea$, is very large. In the numerical example it is $10 k_B T$ per layer separation a i.e. 250 mV per 1nm, i.e., $2.5 = 10^8 V/m$. However, the application of such fields is quite feasible with existing technology.

If the read and write fields are of opposite sign to one another the bits can be written and read at the same side of the multilayer using EAD, since the bits will move in opposite directions under the influence of the two fields.

The last bit in will be the first bit out. If reading and writing are to be done at separate times, using the long hold time of the alternating layer device, it is possible to abandon EAD and use CD instead.

The hold time can be increased by lowering the temperature and so lengthening $\tau_{12}(s)$ until it equals $\tau_{11}$. In the numerical example this equality occurs at $T=140K$, below which the hold time would be 2.17 hours. Further lowering of the temperature leaves the hold time unaffected.

As will be apparent, there are two hold times to consider. The first is the hold time before diffusion destroys the bit pattern when the field is on and the bits are being written in or read out. This is the hold time considered in relation to FIG. 1. This time sets the maximum write-read time; i.e. it sets the maximum byte length as limited by diffusion. The second hold time is the time the bit pattern is retained statically in small or zero field before diffusion destroys the bit pattern. These hold times may be referred to respectively as the dynamic hold time and the static hold time. The dynamic hold time can be lengthened by using the previously described technique of storing one bit in M layers of which one has high A and (M−1) have low A. This exponentially lengthens $\tau_{11}$ which is the upper limit to the static hold time which can be reached on lowering the temperature.

With the present numerical example then for M=3 (i.e. where there are 2 layers of type 2 between each layer of type 1) $\tau_{11}$ becomes 200,000 years. At liquid nitrogen temperature, $T=77K$, $\tau_{12}(s)$ is 6,000 years.

Some materials suitable for forming the various components of the device according to the invention will now be discussed.

The electrodes both apply the electric field across the device and also supply the transit electrons from the D layer and collect the transit electrons at the F layer. They can be metals or doped semiconductors. They can be substrates onto which LB layers are deposited; or they can be evaporated or sputtered onto such LB layers. For semiconductor electrodes with photon energies below the semiconductor band-gap the electrode is transparent; otherwise the electrode is semi-transparent (and opaque if thick).

Figure 5:
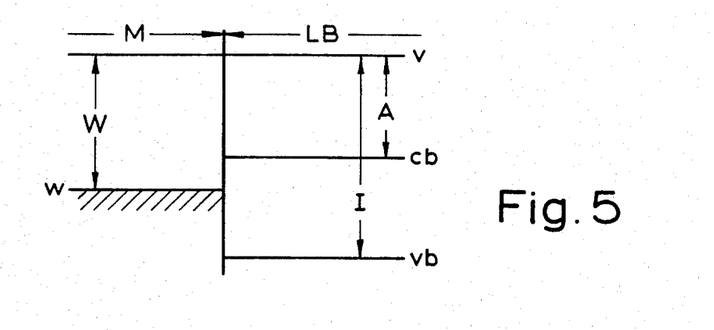
FIGS. 5 to 7 show the energy levels for three arrangements of the photo-injector which can be used.

The layer D forming the electron photo-injector can be a metal, in which case D is also the electrode. FIG. 5 shows that the minimum photon energy $\hbar\omega_D$ to photo-inject an electron is given by $\hbar\omega_D = W - A$. The metal electrode is denoted M and the LB layer as LB. v is the reference energy of an unbound electron at rest, cb is the conduction band edge of the material of the LB layer (e.g. PDA) at an energy A below V, vb is the valence band edge of PDA or an energy I below V, and w is the Fermi level of the metal at an energy W below v. The available range of W is large so $\hbar\omega_D$ can virtually be chosen at will.

Suitable metals for use as metal electrodes on PDA crystals include Ag, Al, Au, Cd, Cu, Ga, Hg, In, Mg, Pb, Zn, Sn.

Figure 6:
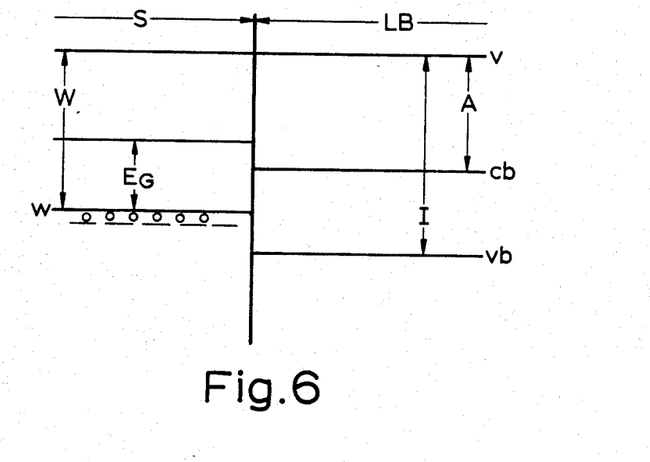

Alternatively D can be a p-type semiconductor, in which case it is also the electrode. FIG. 6 shows that the minimum energy to photo-inject using a semiconductor S is $\hbar\omega_D = E_G$ (provided $A > W - E_g$). W is the valence band edge of the semiconductor at energy W below v, $E_G$ is the energy gap of the semiconductor, and the other symbols have the same meaning as in FIG. 5. Suitable semiconductors include Ge, Si, GaAs, GaSb, InP, InAs, InSb, HgTe.

Figure 7:
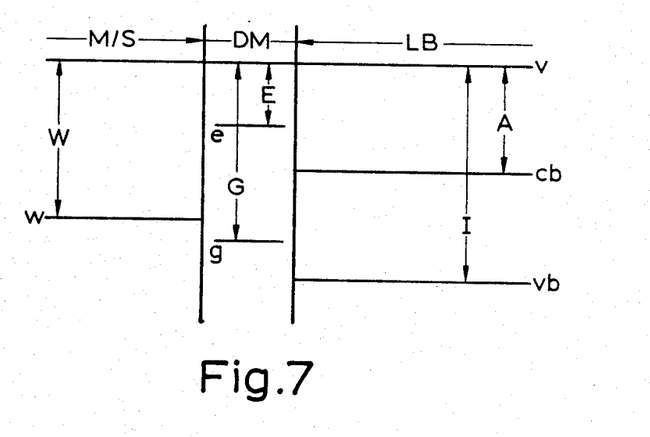

Another possibility is for D to be a dye molecule DM, shown in FIG. 7. The dye is a strong adsorber of photons of energy $(G - E)$, creating an exciton at energy level e. The exciton can auto-ionise to create an electron at level cb and a hole at level w if $(G - E) < W - A$. The net result of the photon adsorbtion is electron injection. The auto-ionisation will only be efficient if DM is a monolayer. LB monolayers of dye molecules can be produced, as is mentioned below in reference to the layer F. In FIG. 7 w is the Fermi level of a metal or the valence band edge of a semiconductor, depending on whether the electrode is a metal M or a semiconductor S, g is the electronic ground slate of the dye DM at energy G below V, e is the first singlet exciton state of the dye at energy E below v, and the other symbols have the same meaning as in FIGS. 5 and 6.

If $(G - E) < 2eV$ the dye exciton will not propagate in the PDA. If the electrode is a semiconductor of $E_G > (G - E)$ the dye exciton will not directly excite the semiconductor. Both these maximise the efficiency of electron injection.

In all cases hole injection in the dark will not occur for $W < I$. Photo-injection of holes can be ignored; any such holes will return due to the applied field across the PDA.

Figure 8:
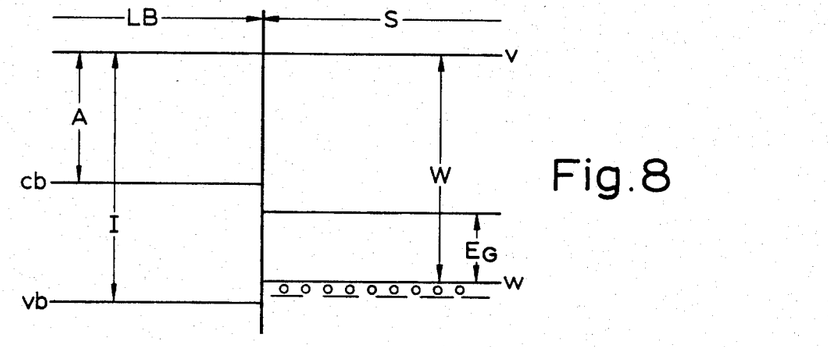
FIGS. 8 to 10 show the energy levels for three arrangements of electron arrival detector which can be used.

The electron arrival detector F can be a p-type semiconductor as shown in FIG. 8. The electron arriving at this electrode can enter the conduction band of the semiconductor provided $W - E_G > A$. The electron is then a minority carrier in the p-type semiconductor and can recombine rapidly by emission of a photon of energy $E_G$. The conditions for such recombination are identical to those required in a semiconductor laser or light-emitting diode, and thus well established. F is then analogous to an LED with the n-type electron injector replaced by the PDA multilayer. It is necessary that $W < I$ so that dark injection of holes does not occur. There is a large range of semiconductors of various $E_G$ and W developed for LED technology from which to choose, including GaAs, GaSb, InP, InAs, InSb, HgTe.

The symbols in FIG. 8 have the same meaning as in FIG. 6.

Figure 9:
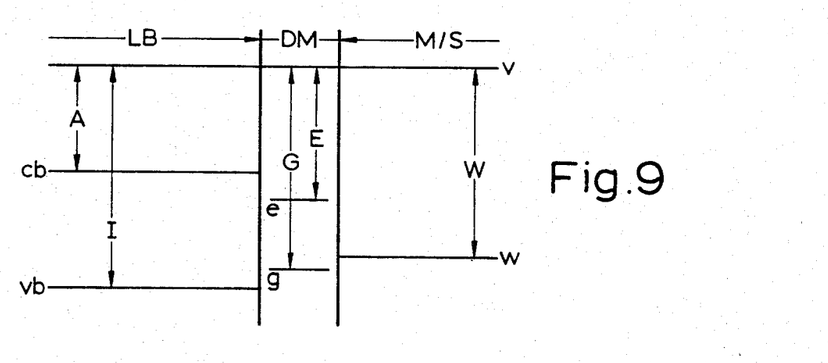

Alternatively, F can be a dye molecule. In a reversal of the exciton auto-ionisation of FIG. 7, FIG. 9 shows creation of the exciton by tunnelling of the arriving electron to the electrode. This process requires $W - A > (G - E)$, and that F be a monolayer for efficiency. The subsequent rapid dye fluorescence is the signature of the electron arrival. The symbols in FIG. 9 have the same meaning as in FIG. 7.

Figure 10:
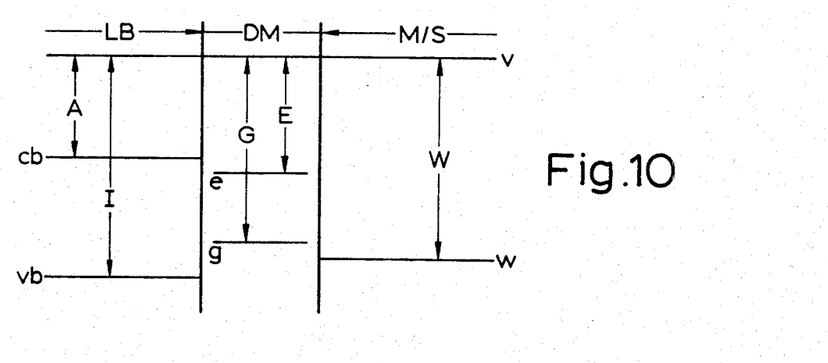

FIG. 10 shows a further scheme not relying on such a tunnelling process in a monolayer, and which would work with thicker dye layers. The symbols have the same meaning as in FIG. 9. The process involves the following steps:

1. Electron: g→w, Heat release: W−G.
2. Electron: cb→e, Heat release: E−A.
3. Fluorescence: e→g, Light emission: G−E.

The net result is an energy release of W−A. For the process to work it is necessary that $E > A$, $G < W$, $I > W$.

Step 1 occurs spontaneously in the dark and creates positively charged dye molecules. In other than a monolayer of dye the positive charge will migrate in the applied field to the dye molecules adjacent to the PDA. The arriving electron, which is highly mobile along the PDA chain, can then hunt in the plane of the film and find the positively charged dye molecule. At Step 2 the electron enters the dye and forms the exciton. Step 3 is the rapid dye fluorescence. Migration of this exciton can be prevented by the methods described above.

Fluorescing dyes in the required range have been studied at length for their use in dye lasers. Dyes can be put in layers by evaporation. If a dye of suitable values of E and G is incorporated in a molecule from which LB layers can be formed, then the dye can be put as mono- or multilayer at the D or F side of the PDA multilayer. For example, LB layers can be formed from lightly substituted anthracene derivatives with aliphatic side chains, for example a derivative where the side chain has four $CH_2$ units (known as C4) and a derivative where it has six $CH_2$ units (known as C6). Attention is directed in this connection to the journal Phys. Technol. Vol. 12, 1981 pp 69 to 87. Also, LB films can be formed of derivatives of perylene to obtain perylene fluorescence in the same way.

The above description has referred to the layers of the memory as being of PDA. However, other materials which form LB films can be used instead. Preferably, these are large conjugated organic molecules, because in such molecules the value of $I - A$ is small and there is therefore less chance of impurity and defect trapping of the electrons destroying the spatial coherence of the memory. For example, the molecules C4 and C6 mentioned above might be used for the memory, as might a derivative of perylene.

Among polydiacetylenes, suitable materials include compounds of the formula $$H(CH_2)_m-C\equiv C-C\equiv C-(CH_2)_n COOH$$

where m and n are integers. Film-forming compounds of this general formula are known where the values of (m,n) are (12,8), (10,8), (14,8), (16,2) or (16,0).

A plurality of independent information holding devices can be created in unit area of a film. Three ways in which this can be done are:

(a) The substrate can have a plurality of independent electrodes fabricated by conventional microelectronic techniques before deposition of the LB layers.
(b) A plurality of independent electrodes can be placed on the LB layers after their deposition.
(c) The LB layers of monomer can be polymerised by UV light. If the light passes through a plurality of holes in a mesh, created by conventional microelectronic technique, a corresponding plurality of information holding devices is created.

These present techniques allow a maximum of the order of $10^5$ devices per $mm^2$. This gives a minimum device fabrication per device of $10^{-11} m^2$, as used in the numerical example given herein. In a device of this area with n PDA layers n bits can be held. This compares with conventional devices in which an area several times this size is needed to hold just one bit.

I claim:

1. A memory for carrying information comprising a multilayer Langmuir-Blodgett film in which each layer is capable of carrying a charge; means for introducing charges into one side of the film in a time sequence which corresponds to the information to be carried, means for applying a voltage between the faces of the film to cause the charge carried by any layer to be transferred to the adjacent layer, and means for reading out the sequence of charges carried by the film.

2. A memory according to claim 1 wherein the layers of the Langmuir-Blodgett film are formed of polymeric material.

3. A memory according to claim 1 wherein the layers of the Langmuir-Blodgett film are formed of a material having a conjugated bond structure.

4. A memory according to claim 1 wherein the layers of the Langmuir-Blodgett film are formed of a polydiacetylene.

5. A memory according to any of the preceding claims wherein said means for introducing charges is arranged to do so in response to input signals representing said information in the form of pulses of photon energy.

6. A memory according to claim 5, wherein the means for introducing charges comprises a layer of a semiconductor.

7. A memory according to claim 5, wherein the means for introducing charges comprises a layer of a photo-injecting metal.

8. A memory according to claim 5, wherein the means for introducing charges comprises a dye monolayer sandwiched between the said film and an electrode.

9. A memory according to claim 1, wherein the means for reading out comprises means for detecting the current flowing in the device, and means for differentiating that current with respect to time.

10. A memory according to claim 1, including a feedback path from the said reading out means to the said means for introducing charges whereby the introduced charges are continuously cycled in the memory.

11. A memory according to claim 1, wherein the means for reading out is located adjacent a face of the film on the opposite side thereof so that adjcent which the means for introducing charges is located.

12. A memory according to claim 11, wherein the means for reading out comprises means adapted to emit photon energy in response to the transfer of charges thereto from the said film.

13. A memory according to claim 12, wherein the means for reading out comprises a layer of a p-type semi-conductor.

14. A memory according to claim 12, wherein the means for reading out comprises a dye monolayer sandwiched between the said film and an electrode, the dye being such that an excition is created therein by tunnelling of an electron to the electrode, whereupon the dye fluoresces.

15. A memory according to claim 12, wherein the means for reading out comprises a layer of a dye sandwiched between the said film and an electrode, the dye being such that positively charged dye molecules are created spontaneously by movement of electrons therefrom into the electrode, whereby electrons arriving from the said film in the dye can create an excition which n its turn causes the dye to fluoresce.

16. A memory according to claim 1, wherein the film is composed of layers of at least two materials having different electron affinities, at least one layer of one of the materials being sandwiched between adjacent layers, or groups of layers, of the other of the materials.

17. A memory according to claim 16, comprising means for cooling the film.

18. A memory according to claim 16, wherein the means for reading out is located on the same side of the film as the means for introducing charges.

* * * * *